(12) United States Patent
Xu et al.

(10) Patent No.: US 10,399,270 B2
(45) Date of Patent: Sep. 3, 2019

(54) PHOTO-CURING 3D PRINTER AND 3D PRINTING METHOD

(71) Applicant: GOLD ARRAY TECHNOLOGY (BEIJING), LLC, Beijing (CN)

(72) Inventors: Beibei Xu, Beijing (CN); Yikun Wang, Beijing (CN); Zhenliang Liu, Beijing (CN); Kaiqiang Zhu, Beijing (CN); Yiyang Fan, Beijing (CN); Houmin Li, Beijing (CN)

(73) Assignee: GOLD ARRAY TECHNOLOGY (BEIJING) LLC, Beijing (CN)

( * ) Notice: Subject to any disclaimer, the term of this patent is extended or adjusted under 35 U.S.C. 154(b) by 0 days.

(21) Appl. No.: 15/118,728

(22) PCT Filed: Jun. 18, 2015

(86) PCT No.: PCT/CN2015/081785
§ 371 (c)(1),
(2) Date: Aug. 12, 2016

(87) PCT Pub. No.: WO2016/173100
PCT Pub. Date: Nov. 3, 2016

(65) Prior Publication Data
US 2018/0036941 A1  Feb. 8, 2018

(30) Foreign Application Priority Data

Apr. 28, 2015 (CN) .......................... 2015 1 0208474

(51) Int. Cl.
*B29C 64/129* (2017.01)
*B33Y 30/00* (2015.01)
(Continued)

(52) U.S. Cl.
CPC .......... *B29C 64/129* (2017.08); *B29C 64/124* (2017.08); *B29C 64/264* (2017.08);
(Continued)

(58) Field of Classification Search
CPC ... B29C 64/106; B29C 64/124; B29C 64/129; B29C 64/135; B29C 64/245;
(Continued)

(56) References Cited

U.S. PATENT DOCUMENTS

| 2005/0152146 | A1* | 7/2005 | Owen | A61L 2/10 362/294 |
|---|---|---|---|---|
| 2016/0046072 | A1* | 2/2016 | Rolland | B33Y 10/00 264/401 |
| 2016/0202540 | A1* | 7/2016 | Lee | G02F 1/133377 349/42 |

FOREIGN PATENT DOCUMENTS

CN    103722745 A  *  4/2014

OTHER PUBLICATIONS

CN 103722745 A, Chen et al., machine language translation Chinese to English (Year: 2014).*

* cited by examiner

*Primary Examiner* — Joseph S Del Sole
*Assistant Examiner* — Lawrence D. Hohenbrink, Jr.
(74) *Attorney, Agent, or Firm* — Marshall, Gerstein & Borun LLP (57) ABSTRACT

Disclosed is a photo-curing 3D printer comprising a storage unit for accommodating liquid photosensitive resin and a light source disposed underneath the storage unit. Wavelength of light rays emitted by the light source is 420~460 nm. A bottom of the storage unit is configured to display a pattern composed of a shielding area for shielding the light rays and a transmissive area for passing-through of the light rays. In addition, the disclosure provides a 3D printing method. Due to the limitations of photopolymerization initiators and the LCD display unit currently available, it was unexpected to complete photo-curing 3D printing with a light source with 420~460 nm wavelength. It is unexpected (Continued)

that a photo-curing 3D printer as provided in the present application not only can ensure the service life of the LCD display unit but also that the curing efficiency is significantly higher than existing devices.

16 Claims, 8 Drawing Sheets

(51) Int. Cl.
| | |
|---|---|
| *B33Y 10/00* | (2015.01) |
| *B29C 64/264* | (2017.01) |
| *B29C 64/393* | (2017.01) |
| *B29C 64/124* | (2017.01) |
| *B29C 64/286* | (2017.01) |
| *B29C 64/106* | (2017.01) |
| *B29C 64/245* | (2017.01) |
| *B33Y 70/00* | (2015.01) |
| *B29C 64/135* | (2017.01) |
| *B29C 64/277* | (2017.01) |
| *B29C 64/282* | (2017.01) |
| *B33Y 50/02* | (2015.01) |
| *G03F 7/00* | (2006.01) |

(52) U.S. Cl.
CPC .......... *B29C 64/286* (2017.08); *B29C 64/393* (2017.08); *B33Y 10/00* (2014.12); *B33Y 30/00* (2014.12); *B29C 64/106* (2017.08); *B29C 64/135* (2017.08); *B29C 64/245* (2017.08); *B29C 64/277* (2017.08); *B29C 64/282* (2017.08); *B33Y 50/02* (2014.12); *B33Y 70/00* (2014.12); *G03F 7/0037* (2013.01)

(58) Field of Classification Search
CPC ... B29C 64/264; B29C 64/286; B29C 64/277; B29C 64/282; B33Y 10/00; B33Y 30/00; B33Y 70/00
USPC .............................. 425/174.4, 375; 264/308
See application file for complete search history.

Fig. 8

PHOTO-CURING 3D PRINTER AND 3D PRINTING METHOD

CROSS REFERENCE TO RELATED APPLICATIONS

This application is a continuation of International Application No. PCT/CN2015/081785 filed on Jun. 18, 2015, which is based upon and claims priority to Chinese Patent Application No. 201510208474.X filed on Apr. 28, 2015, the entire contents of which are incorporated herein by reference.

TECHNICAL FIELD

The disclosure relates to the field of three-dimensional (3D) printers, and in particular to a photo-curing 3D printer employing an LCD display unit and a 420~460 nm light source. In addition, the present invention also relates to a 3D printing method.

BACKGROUND

Among 3D printing technologies, the photo-curing rapid molding technology is relatively common. In the technology, photosensitive resin (UV) in a liquid state performs polymerization under the irradiation of light. A light source irradiates according to a cross-section shape of an entity to be cured so that the liquid photosensitive resin cures, molds, accumulates, and overlaps and a cured entity is formed finally.

Currently, a photo-curing rapid molding device based on the above-mentioned principle mainly comprises a selective laser curing device (SLA, which is also referred to as a stereoscopic photo-curing molding device) and a mask photo-curing device (DLP).

The selective laser curing device uses laser with a specific intensity and a 405 nm wavelength to focus onto the surface of the liquid photosensitive resin so as to make the surface cure sequentially from point to line and from line to surface, thus completing a cross-section thin layer of an object to be printed. Subsequently, another cross-section thin layer is cured in this manner. The first and second cured cross-section thin layers are overlapped and in this manner a three-dimensional object to be printed is completed finally. Due to the usage of the above-mentioned curing procedure, when printing a large three-dimensional object or printing a plurality of three-dimensional objects, the speed of this 3D printing device based on SLA technology is slow and the efficiency is low.

The mask photo-curing device uses a DLP projector to project a two-dimensional graph of a certain cross section of the object to be printed on the liquid photosensitive resin so as to make the liquid photosensitive resin to cure a thin layer with a corresponding shape according to this graph. Then, the cured thin layers are adhered and accumulated layer by layer so as to form a cured printed object. The mask photo-curing device can print a relatively large three-dimensional object rapidly and has a relatively high resolution. However, since a DLP device has to be used, the price is high, which cannot be afforded by common customers.

In addition, whether for the selective laser curing device or for the mask photo-curing device, they both have complex light paths, which introduces relatively long delay during printing and thus reduces the curing efficiency.

Another photo-curing printer uses an LCD display unit to display a cross-section pattern of the object to be printed. A light source with 300 nm~700 nm wavelength irradiates the LCD display unit, and after light rays transmit the LCD display unit, the liquid photosensitive resin in the resin pool is cured to a corresponding shape. However, the service life of this type of printer is very short.

SUMMARY

In light of the problems existing in the prior art, the present invention provides a photo-curing 3D printer comprising a storage unit for accommodating liquid photosensitive resin and a light source disposed underneath the storage unit. Wavelength of light rays emitted by the light source is 420~460 nm and bottom of the storage unit is configured to display a pattern composed of a shielding area for shielding the light rays and a transmissive area for passing-through the light rays.

In one embodiment of the disclosure, the storage unit includes a pool and an LCD display unit with a bottom wall of the pool being at least transparent and the LCD display unit being laid above or below the bottom wall of the pool.

The installation location of the LCD display unit is not limited, as long as the light rays emitted by the light source can transmit the LCD display unit and the bottom wall of the pool so that the liquid photosensitive resin can be cured. In particular, in order to facilitate the maintenance of the LCD display unit, it can be laid on an external surface of the bottom wall of the pool so that the maintenance person can maintain it conveniently. In order to avoid the LCD display unit being damaged due to the collision of an external face, it can also be laid on an inner surface of the bottom wall of the pool. In addition, the LCD display unit can also replace the bottom wall of the pool.

In one embodiment of the disclosure, the light source comprises a light-emitting element for emitting 420~460 nm light rays; a concentration element being used with the light-emitting element; and a lens provided above the concentration element and the light-emitting element. The concentration element and the lens are configured to be capable of homogenizing and paralleling the light rays emitted by the light-emitting element.

The concentration element can use a reflective bowl so that the light rays emitting by the light source to the surroundings can concentrate and then a plurality of light rays irradiate the LCD display unit in parallel via the lens. This arrangement method not only improves the utilization of light rays but also simplifies the structure of the light path, so that the weight of the entire photo-curing 3D printer is light and the volume is small.

In one embodiment of the disclosure, the light source further includes a heat dissipation element provided underneath the light-emitting element; and a blasting element provided around the heat dissipation element for sending cold air to the heat dissipation element.

In order to irradiate the entire surface of the LCD display unit, the light-emitting element usually will use an LED lamp array to form a planar light source. After being turned on for a period of time, the LED lamp array will generate much heat, and it could be damaged due to the accumulation of heat if the heat is not dissipated in time. Therefore, providing a heat dissipation element such as heat sink and a heat bar underneath the light-emitting element can effectively increase the heat dissipation area and conduct the accumulated heat to the outside. A blasting element is also provided around or underneath the heat dissipation element so as to send cold air to the heat dissipation element, which can further accelerate the heat dissipation speed. The blasting element can use a fan.

In some embodiments of the disclosure, the light source comprises a light-emitting element for emitting 420~460 nm light rays; a bearing plate having a bottom wall and a surrounding wall, the bottom wall of the bearing plate being used for bearing the light-emitting element and the surrounding wall of the bearing plate being used for fixedly connected to the bottom wall of the pool.

In order to further simplify the light path, the light-emitting element can be directly fixed on the bottom wall of the photosensitive resin pool through the bearing plate. The distance between the light-emitting element and the bottom wall of the photosensitive resin pool can be less than or equal to 10 mm. Also, elements such as the lens, the reflective bowl, and the Fresnel lens which are used for concentrating light or homogenizing light rays can be omitted. In this way, not only the utilization of the light rays emitted by the light source can be improved, the lower space of the photo-curing 3D printer can be greatly narrowed so that the structure of the entire photo-curing 3D printer is more compact and more handy, but also the price of the light source is also cheaper and the economic burden of the customer is relieved.

In order to further improve the utilization of the light rays emitted by the light source and avoid the light rays escaping to the outside of the light source, the surrounding wall of the bearing plate is at least of a reflective material.

In one embodiment of the disclosure, the light source further comprises a heat dissipation element provided underneath the bearing plate and a blasting element provided around the heat dissipation element for sending cold air to the heat dissipation element.

The light source provided in this embodiment includes a light-emitting element and a heat dissipation element and is fixed onto the bottom of the photosensitive resin pool through the bearing plate. Namely, the light source and the storage unit are integrated. Such a light source not only can provide sufficient light rays to the LCD display unit so as to obtain better photo-curing effects but also the structure of the light source is simpler and the cost is lower, and in addition a heat dissipation element and a blasting element are added in view of the heat dissipation problem.

In one embodiment of the disclosure, the LCD display unit is laid above the bottom wall of the pool and the storage unit further comprises a Fresnel lens provided between the bottom wall of the pool and the LCD display unit so that the light rays become parallel and more homogeneous before irradiating onto the LCD display unit.

In one embodiment of the disclosure, the LCD display unit is laid above the bottom wall of the pool and the storage unit further comprises a semipermeable membrane located above the LCD display unit, the semipermeable membrane matching the area of the LCD display unit so as to form a cavity therebetween; and an inflation unit communicated with the cavity via a pipeline for inflating gas containing oxygen molecules into the cavity.

There may be a very large resistance when the cured photosensitive resin separates from the LCD display unit. In order to protect the LCD display unit, prolong the service life thereof, and avoid the surface of an object to be printed uneven during separation, a semipermeable membrane can be laid on the LCD display unit. The area of the semipermeable membrane can be equal to or slightly greater than the area of the LCD display unit. Two ends of the semipermeable membrane can be adhered to the edge of the LCD display unit or a sidewall of the pool so that a cavity is formed between the semipermeable membrane and the LCD display unit. Gas containing oxygen molecules is inflated into the cavity through the inflation unit, and the oxygen molecules transmit the semipermeable membrane and form an oxygen molecule layer on its surface. The existence of the oxygen molecule layer can avoid the cured photosensitive resin adhering onto the LCD display unit so that the cured photosensitive resin can separate from the LCD display unit easily. Bottom of the separated printed object may be uneven, which not only protects the LCD display unit but also facilitates the improvement of the molding precision of the cured object.

In one embodiment of the disclosure, the LCD display unit includes a first polarization layer, a TFT layer, a liquid crystal layer and a second polarization layer from bottom to top. Currently, in order to make human eyes receive lights rays with a certain saturated color, the existing LCD display unit usually provides a color filter between the liquid crystal layer and the second polarization layer. Since the color filter has different transmittances to different light rays, some light rays with a certain wavelength emitted by the light source may concentrate inside the LCD display unit, and finally, the liquid crystal layer is damaged due to the absorption of energy. However, in 3D printing technologies, no high requirements are put on the color presented by the LCD display unit, and therefore removing the color filter can effectively avoid the above-mentioned defects. After removing the color filter, the light source can also use a low power light source, which is approximately $\frac{1}{3}$~$\frac{1}{2}$ of the power of a general light source.

In addition, after removing the color filter, the thickness of the LCD display unit can be reduced by about 0.4~0.6 mm, which not only can make it fix inside the photosensitive resin pool more conveniently but also no excessive space in the photosensitive resin pool is occupied to store the liquid photosensitive resin. The LCD display unit has a certain area. When the above-mentioned thickness is reduced, an operator can add more liquid photosensitive resin into the photosensitive resin pool each time, which indirectly improves the printing speed of the 3D printer and reduces labor cost. Also, the price of the color filter is high, which occupies about 30% of the entire LCD display unit, but it is unnecessary to the 3D printing technology provided in the present invention. Removing the color filter will undoubtedly relieve the economic burden of the customer, enlarge the application scope of the 3D printer provided in the present invention, and even can be provided to general families for use.

Furthermore, the LCD display unit used in the present invention need not display colors and only needs to display a cross-section pattern of the object to be printed with a transmitting area (white) and a shielding area (black). Then, 420~460 nm light rays emitted by the light source transmit the transmitting area to cure the liquid photosensitive resin to be a thin layer corresponding to the pattern of the shielding area. The requirements on the LCD display unit by this molding method are not high, which can further reduce the cost.

In one embodiment of the disclosure, the liquid crystal layer is configured to have a usage state and an idle state. In the usage state, the liquid crystal layer is capable of changing polarization direction of polarized light transformed by the first polarization layer. In the idle state, the liquid crystal layer is incapable of changing the polarization direction of the polarized light.

The first polarization layer and the second polarization layer have orthogonal polarization directions. The liquid crystal layer can adjust the polarization direction of the light rays so that the polarized light transformed by the first polarization layer can be emitted through the second polarization layer. When a voltage is applied to the liquid crystal layer, it is in a usage state and can adjust the polarization direction of the polarized light. When no voltage is applied to the liquid crystal layer, it is in an idle state and cannot adjust the polarization direction and therefore the polarized light cannot be emitted through the second polarization layer. In this way, when the LCD display unit is not in use, even the light source is turned-on, the light rays emitted thereby cannot transmit the LCD display unit to irradiate the liquid photosensitive resin to cure the same. During printing, a curing error of the liquid photosensitive resin will not appear due to the occurrence of procedure errors, which can improve the tolerance rate of the device.

The liquid crystal layer can adjust the angle of the polarized light according to the magnitude of the voltage applied thereto so as to adjust how many light rays are emitted by the second polarization layer, that is, adjust the intensity of the light rays emitted by the second polarization layer. The intensity of the light rays will directly affect the curing time of the liquid photosensitive resin, and therefore, the printing speed can be controlled in this way.

In one embodiment of the disclosure, the photo-curing 3D printer further comprises a bearing unit provided above the storage unit for bearing cured photosensitive resin; and a control unit for controlling the light source to turn on or turn off and pattern display of the LCD display unit and controlling vertical movement of the bearing unit.

In one embodiment of the disclosure, the photo-curing 3D printer further includes 420~460 nm liquid photosensitive resin to be provided in the storage unit.

In one embodiment of the disclosure, the wavelength of the light rays emitted by the light source is 420~430 nm, preferably 425 nm.

After further researches, when a light source with 425 nm wavelength is used, the curing time of the liquid photosensitive resin reaches 2 s. Compared to the curing time of the existing 3D printer which is 10 s~20 s, the printing speed of the present disclosure is improved by 5~10 times. Compared to the curing time of each layer of an SLA type printer which is 30 s, the printing speed of the present disclosure is improved by 15 times. When a large three-dimensional object is printed, this object will be divided into a plurality of thin layers, and the liquid photosensitive resin is cured as a thin layer when being irradiated with a light source and the subsequent thin layers accumulate step by step. Then, when the time to cure a thin layer is shorted to 2 s from 10 s~20 s, the time to print the entire three-dimensional object will be shorted greatly. During batch industrial production, when a plurality of objects need to be printed, the economic benefits are huge due to the improvement of the printing efficiency.

In one embodiment of the disclosure, wavelength of the light rays emitted by the light source is 445~455 nm, preferably 450 nm.

A light source with 445~455 nm wavelength is selected, especially a light source with 450 nm wavelength, the photo-curing precision of which is 10~15 times of the conventional light sources and the molding speed is 2~3 times of conventional devices.

The disclosure also provides a 3D printing method comprising accommodating, by a storage unit, liquid photosensitive resin; displaying, by an LCD display unit, a cross-section pattern of an object to be printed; and irradiating, by a light source which is capable of emitting light rays with 420~460 nm wavelength, the LCD display unit, the light rays irradiating the liquid photosensitive resin accommodated in the storage unit by passing through the storage unit and the LCD display unit so as to make the same cured with a shape corresponding to the cross-section pattern of the object to be printed.

The disclosure also provides another 3D printing method comprising accommodating, by a storage unit, liquid photosensitive resin; displaying, by an LCD display unit, a cross-section pattern of an object to be printed; and providing a semipermeable membrane matching the area of the LCD display unit above the LCD display unit so as to form a cavity therebetween; irradiating, by a light source which is capable of emitting light rays with 420~460 nm wavelength, the LCD display unit, the light rays irradiating the liquid photosensitive resin accommodated in the storage unit by passing through the storage unit and the LCD display unit so as to make the same cured with a shape corresponding to the cross-section pattern of the object to be printed; and at the same time of irradiating as set forth above, inflating, by an inflation unit, gas containing oxygen molecules into the cavity.

The disclosure provides yet another 3D printing method, including: accommodating, by a storage unit, liquid photosensitive resin; displaying, by an LCD display unit, a cross-section pattern of an object to be printed; providing a semipermeable membrane matching the area of the LCD display unit above the LCD display unit so as to form a cavity therebetween; irradiating, by a light source which is capable of emitting light rays with 420~460 nm wavelength, the LCD display unit, the light rays irradiating the liquid photosensitive resin accommodated in the storage unit by passing through the storage unit and the LCD display unit so as to make the same cured with a shape corresponding to the cross-section pattern of the object to be printed; at the same time of irradiating as set forth above, inflating, by an inflation unit, gas containing oxygen molecules into the cavity; turning off the light source and controlling, by a control unit, the bearing unit to move to a predetermined location; and repeating displaying by an LCD display, providing a semi permeable membrane matching area, irradiating by a light source, and turning off the light source as set forth above f until a complete printed object is formed.

The 3D printing method provided in one embodiment of the disclosure uses a light source which emits light rays with 420~460 nm wavelength and an LCD display unit. In order to be able to cure a cross-section thin layer of the printed object layer by layer continuously, the control unit and the bearing unit can cooperate so that the bearing unit moves upward a certain distance after the curing of a thin layer is completed. At this moment, the cured thin layer is adhered to the bearing unit or a previous thin layer, and the uncured liquid photosensitive resin will fill between the bearing unit (or a previous thin layer) and the LCD display unit. Under the control of the control unit, the LCD display unit and the light source display each cross-section pattern of the object to be printed subsequently according to a preset procedure and a thin layer with a corresponding shape is formed after being irradiated by the light source. A plurality of thin layers overlap and accumulate to finally form a printed object. The printing method provided in one embodiment of the disclosure is totally different from the existing way of from-point-to-line and from-line-to-surface curing method but directly uses a thin layer curing (surface curing) method. This method not only has a relatively high molding precision but also greatly improves the printing speed.

When to select the wavelength of the light source, since light rays with wavelength below 400 nm have very high energy, based on the structure features of the LCD display unit, when the LCD display unit is irradiated by a light source below 400 nm, the energy will accumulate inside the display unit and is difficult to release. This will greatly shorten the service life of the LCD display unit and even directly damage the LCD display unit. For example, currently, a light source with 405 nm wavelength is used to continuously irradiate the LCD display unit, and the LCD display unit will be damaged within several minutes due to energy accumulation. When the LCD display unit is irradiated by a light source with 420 nm~460 nm wavelength provided one embodiment of the disclosure, the service life is over 10 thousand hours and there will be no damage. The problem only lies in that the imaging quality of the LCD display unit will slightly reduce over the usage of the LCD display unit. After 10 thousand hours, the imaging quality of the LCD display unit will reduce by half. Therefore, the 3D printer provided in the disclosure is more durable, and the curing precision is more reliable, which does not need frequent maintenance and can greatly reduce the cost.

Another factor that should be taken into account is a photopolymerization initiator added in the liquid photosensitive resin, which can absorb irradiation energy, changes chemically after stimulation, and generate an active midbody having an initiation polymerization capability. The polymerization initiator plays a critical role on the curing speed of the photosensitive resin, and liquid photosensitive resin not added with a polymerization initiator will not cure whether being irradiated with whatever wavelength. The absorption peaks of the polymerization initiator are all within an ultraviolet waveband, and the absorption values thereof will fluctuate irregularly with the increasing of the wavelength of the light rays. Generally, in order to improve the photo-curing efficiency and precision, a light source prone to ultraviolet wavelength will be selected.

In summary, one can only select between a light source which is beneficial to the LCD display unit and a light source which is beneficial to liquid photosensitive resin curing, thus forming a technical prejudice that a 400 nm light source prone to ultraviolet wavelength is selected. However, it was not known to complete photo-curing 3D printing with a light source with 420~460 nm wavelength, especially a light source with 450 nm wavelength. However, the applicants unexpectedly found that the photo-curing 3D printer provided in the disclosure not only can ensure the service life of the LCD display unit but also the curing efficiency is apparently higher than that of existing devices, and the printing precision can be up to 20 μm~100 μm. Compared to the printing precision of existing photo-curing 3D printing devices, which is 200 μm~400 μm, the disclosure offers up to a 20 times improvement over existing photo-curing 3D printing devices. The improvement and technical effects are unexpected.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
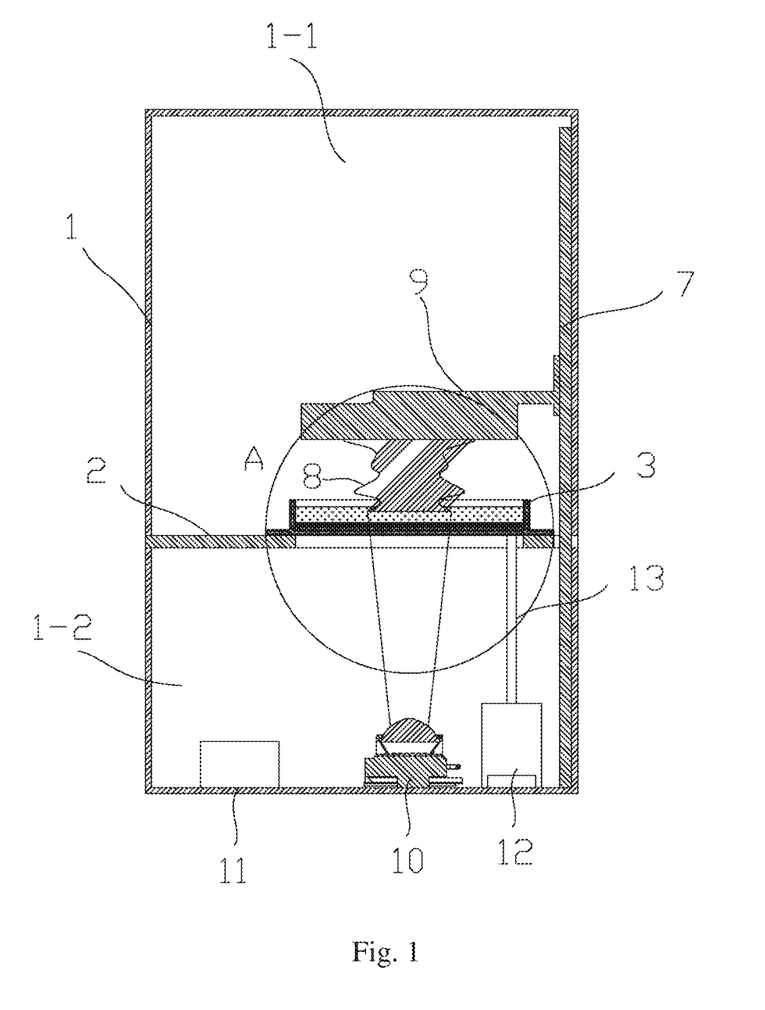
FIG. 1 is a structural schematic diagram of a photo-curing 3D printer according to an embodiment of the disclosure.

As shown in FIG. 1, a photo-curing 3D printer provided in this embodiment has a housing framework 1. A middle layer plate 2 divides an inner space of the housing framework 1 into an upper space 1-1 and a lower space 1-2. A photosensitive resin pool 3 used as a storage unit of liquid photosensitive resin is provided on the middle layer plate 2.

One side of the interior of the housing framework 1 is provided with a guide pillar 7. The guide pillar 7 enters the upper space 1-1 from the lower space 1-2 through the middle layer plate 2. A bearing platform 9 used for bearing an object 8 to be printed is provided above the photosensitive resin pool 3. The platform 9 can perform vertical movement inside the upper space 1-1 along the guide pillar 7. The guide pillar 7 can be designed as a lead screw, which can be rotated by a step motor. The bearing platform 9 can be designed as a matching screw nut seat so as to perform vertical movement under the rotation movement of the lead screw.

A light source 10 is provided in the lower space 1-2 at the very bottom of the housing framework 1 and is located corresponding to that of the photosensitive resin pool 3 so that the light source 10 can emit light rays with 420~460 nm wavelength to the photosensitive resin pool 3. In order to cure the liquid photosensitive resin borne in the photosensitive resin pool 3, a bottom wall of the photosensitive resin pool 3 uses a transparent material which can transmit the light rays of the above-mentioned light source 10. Also, the middle layer plate 2 has a hollow area for the light rays emitted by the light source 10 to pass through or uses a transparent material which is the same as the bottom of the photosensitive resin pool 3.

Figure 2:
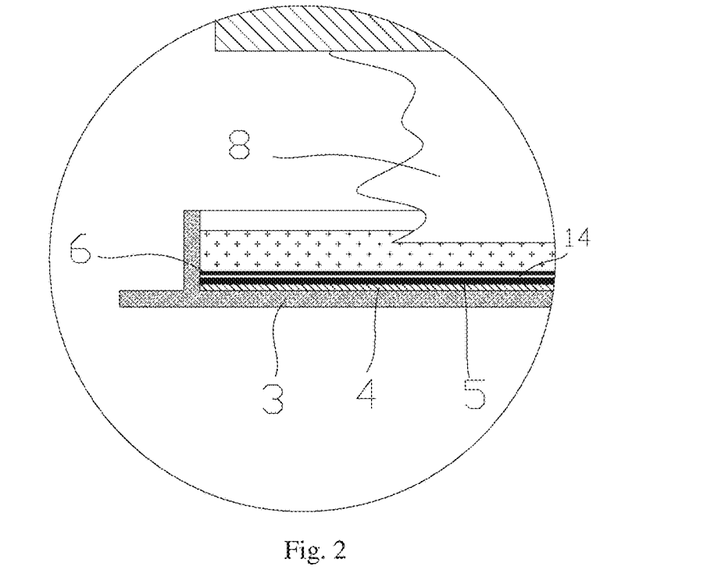
FIG. 2 is a partial enlarged schematic diagram of section A in FIG. 1.

As shown in FIG. 2, the photosensitive resin pool 3 has a bottom wall and a sidewall provided above the bottom wall. The bottom wall and the sidewall form an accommodation space for accommodating the liquid photosensitive resin. On an inner surface of the bottom wall of the photosensitive resin pool 3, a Fresnel lens 4, an LCD display unit 5 and a high molecule semipermeable membrane 6 are laid subsequently from bottom to top. The area of the high molecule semipermeable membrane 6 is equal to that of the LCD display unit 5 with the edge thereof being fixedly adhered to the sidewall of the photosensitive resin pool 3 or to the edge of the LCD display unit so that a cavity 14 is formed between the high molecule semipermeable membrane 6 and the LCD display unit 5.

An air pump 12 is provided at the very bottom of the lower space 1-2 of the housing framework 1 and located at the right side of the light source 10. The air pump 12 is communicated with the cavity 14 through a pipeline 13 and can pump mixed gas containing 20%-100% oxygen into the interior of the cavity 14. The oxygen molecules in the mixed gas can pass through the high molecule semipermeable membrane 6 and forms an oxygen molecule layer (not shown) on the high molecule semipermeable membrane 6. The function of the oxygen molecule layer is to prevent the object 8 to be printed from adhering onto the LCD display unit 5. This layer can facilitate separation of the object 8 to be printed so as to improve molding quality. The high molecule semipermeable membrane 6 can use a perfluorinated ethylene-propylene copolymer (FEP) film or a Poly-4-methy-11-pentene (TPX) film.

A control unit 11 is provided at the very bottom of the lower space 1-2 of the housing framework 1 and located at the left side of the light source 10. The control unit 11 can be an externally connected computer and can also be formed by a chip and a control panel onboard a 3D printer. The control unit 11 can control a step motor associated with the guide pillar 7 to rotate forwardly or reversely so that the bearing platform 9 moves up and down along the guide pillar 7. The control unit 11 can also control the turning-on or turning-off of the light source 10, the time for the air pump 12 to pump mixed gas into the cavity 14 and a pattern displayed by the LCD display unit 5.

It should be noted that the LCD display unit 5 can also be placed on an outer surface of the bottom wall of the photosensitive resin pool 3 so that the light rays first pass through the LCD display unit 5 and then transmit the bottom wall of the photosensitive resin pool 3, and finally cure the liquid photosensitive resin accommodated in the photosensitive resin pool 3 onto the bearing platform 9. Alternatively, the bottom wall of the photosensitive resin pool 3 can be replaced with the LCD display unit 5 directly.

Figure 3:
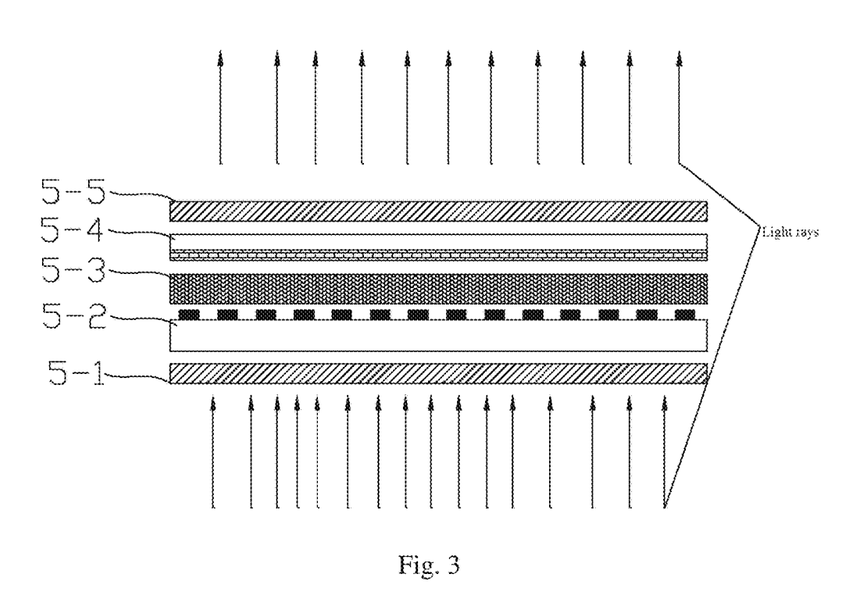
FIG. 3 is a structural schematic diagram of an LCD display unit of a photo-curing 3D printer according to an embodiment of the disclosure.

Referring to FIG. 3, the LCD display unit 5 in this embodiment has a lower polarizer 5-1, a TFT substrate 5-2, a liquid crystal layer 5-3, a color filter 5-4 and an upper polarizer 5-5 provided layer by layer from bottom to top. The light rays are transformed to polarized light through the lower polarizer 5-1, and the polarization direction of the upper polarizer 5-5 is orthogonal to that of the polarized light.

The light rays emitted by the light source 10 transmit the bottom wall of the photosensitive resin pool 3 and transformed to polarized light after passing through the lower polarizer 5-1. When the liquid crystal layer 5-3 is energized, the polarization direction of the light rays changes when the light rays transmit the liquid crystal layer 5-3, and therefore some light rays can pass the color filter 5-4 and reach the upper polarizer 5-5 and then emit out through the upper polarizer 5-5 and finally irradiates the liquid photosensitive resin borne in the photosensitive resin pool 3 so as to make it cure on the surface of the bearing platform 9. By adjusting the magnitude of the voltage applied to the liquid crystal layer 5-3, the light emergence proportion can be adjusted. When the liquid crystal layer 5-3 is not energized, the polarization direction of the polarized light does not change. Since the polarization direction of the upper polarizer 5-5 is orthogonal to the polarization surface of the polarized light, the light rays cannot pass through the upper polarizer 5-5. That is, when the LCD display unit is not energized, even the LCD display unit 5 is irradiated with the light source 10, the light rays will not transmit to cure the liquid photosensitive resin in the photosensitive resin pool 3.

All cross-section patterns of the object to be printed are stored in the control unit 11 in advance. When the printing operation starts, the control unit can transfer a certain one cross-section pattern of the object 8 to be printed to the LCD display unit 5 so that the LCD display unit 5 can present translucidus area corresponding to this pattern. The translucidus area is configured to allow light rays with 420~460 nm wavelength emitted by the light source pass through. The other area than the translucidus area are all shadow area which prevents passing of light rays with 420~460 nm wavelength emitted by the light source. Therefore, after passing through the LCD display unit 5, the light rays can cure the liquid photosensitive resin to be a thin layer with a shape being the same as that of a certain cross-section pattern of the object 8 to be printed. The light source 10 is turned off after a certain period of time, and at this moment, the control unit 11 will control the LCD display unit 5 to switch to display a next cross-section pattern of the object to be printed 8. At the same time, the bearing platform 9 moves upward a pre-determined distance so that new liquid photosensitive material can flow in-between the high molecule semipermeable membrane 6 and the cured thin layer. The light source 10 is turned on again and the next cross-section pattern of the object 8 to be printed is cured and accumulated under the thin layer formed previously. The above process is repeated and finally a complete object 8 to be printed can be formed.

In order to make human eyes receive light rays with a certain saturated color, the existing LCD display units are all provided with a color filter 5-4 which can have different transmittances to light with different wavelengths. When light rays with wavelength below 400 nm is used to irradiate, since the transmittance of the color filter 5-4 to the light rays within this wavelength range is low and the light rays within this wavelength range have relatively high energy, the energy of the light rays will be concentrated into the LCD display unit 5. Since the liquid crystals in the liquid crystal layer 5-3 are high molecules, the energy accumulated in the LCD display unit will damage the liquid crystals in the liquid crystal layer 5-3 and finally the LCD display unit 5 will lose the imaging function completely. Therefore, a light source with 445~455 nm wavelength, especially a light source with 450 nm wavelength, is selected to significantly improve the service life of the liquid crystal layer 5-3, that is, the service life of the LCD display unit 5.

In order to obtain better effects, the color filter 5-4 in the existing LCD display unit 5 can be removed, which can prevent the energy accumulating in the LCD unit and the power of the light source can be reduced ½. In this case, except a 445~455 nm light source, a light source with 420~430 nm wavelength, especially a light source with 425 nm wavelength, can also be selected to irradiate the liquid photosensitive resin. This also has good curing effects, and at the same time, the service life of the LCD display unit will not be shortened substantially.

Figure 4A:
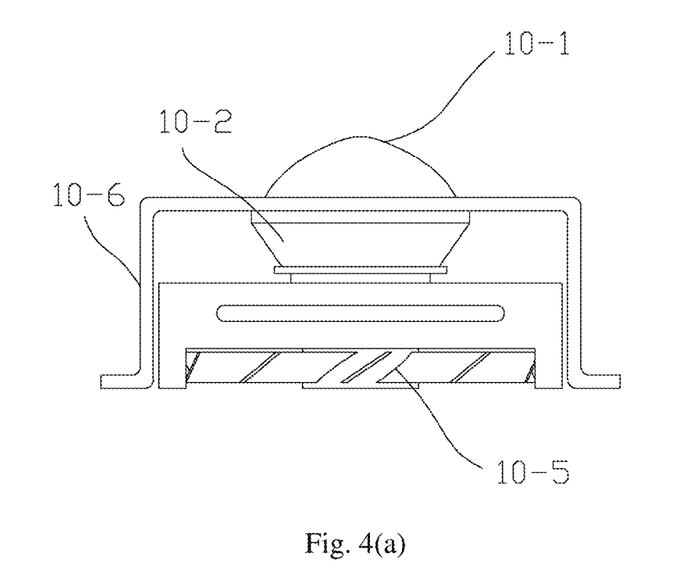
FIGS. 4(a)-4(c) are structural schematic diagrams of a light source of a photo-curing 3D printer according to an embodiment of the disclosure.
Figure 4B:
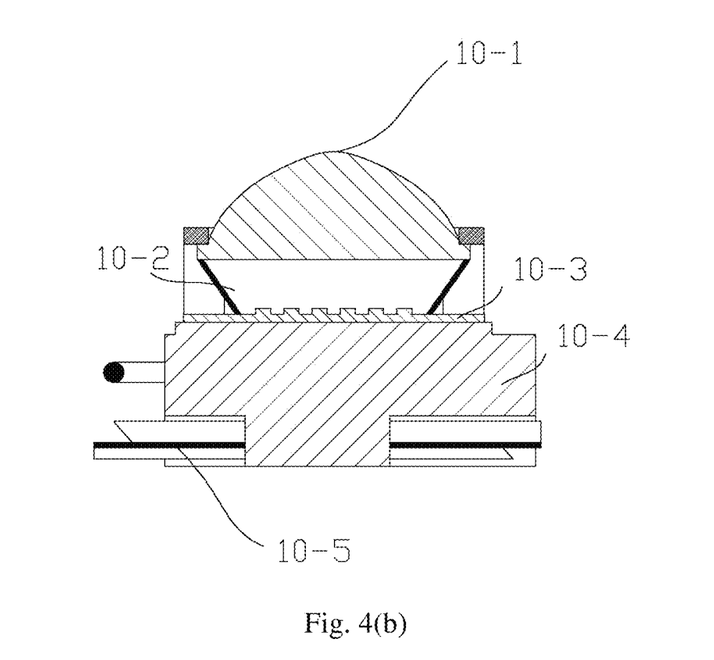
Figure 4C:
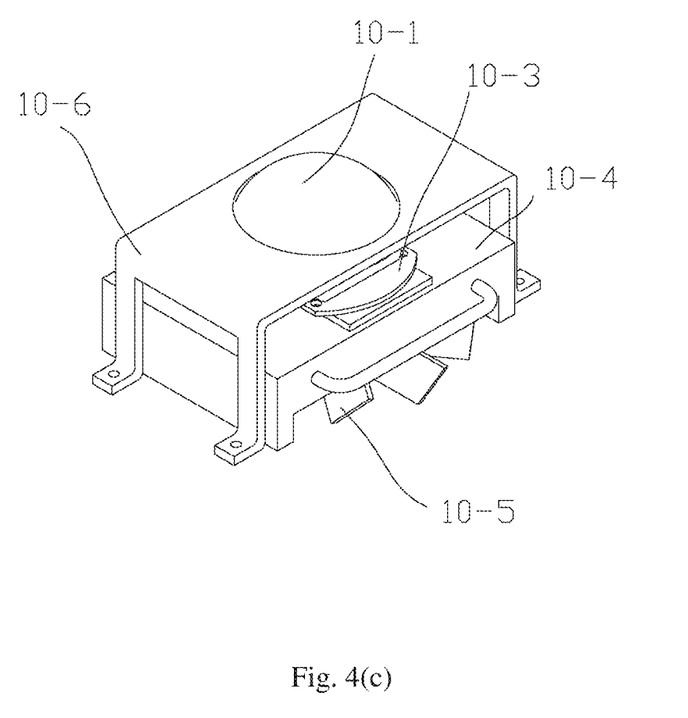

With reference to FIGS. 4(*a*)-4(*c*), in this embodiment, the light source 10 which can provide light rays with 420~460 nm wavelength is composed of a lens 10-1, a reflective bowl 10-2, an LED lamp array 10-3, a heat sink 10-4, a fan 10-5 and a lens press plate 10-6. Since power of a single LED lamp is low, the light thus emitted is insufficient to cure the liquid photosensitive resin. Therefore, the core component of the light source 10 uses a LED lamp array 10-3. Above the LED lamp array 10-3, the reflective bowl 10-2 for concentrating light rays and the lens 10-1 for paralleling and homogenizing light rays are provided sequentially. The reflective bowl 10-2 concentrates light emitted by the LED lamp array 10-3 and then the lens 10-1 emits the light in a parallel manner so that the light rays can completely cover the LCD display unit 5. The lens 10-1 is fixed by the lens press plate 10-6 with the angle of which can be 45~180 degrees, and the effects of 60 degrees and 90 degrees are optimal. Since the LED lamp array 10-3 will generate heat during operation, the heat sink 10-4 is provided underneath and adhered to the LED lamp array. Then, the fan 10-5 is provided under and around the heat sink 10-4 so as to send cold air to the heat sink 10-4 realizing better cooling effects.

Figure 5:
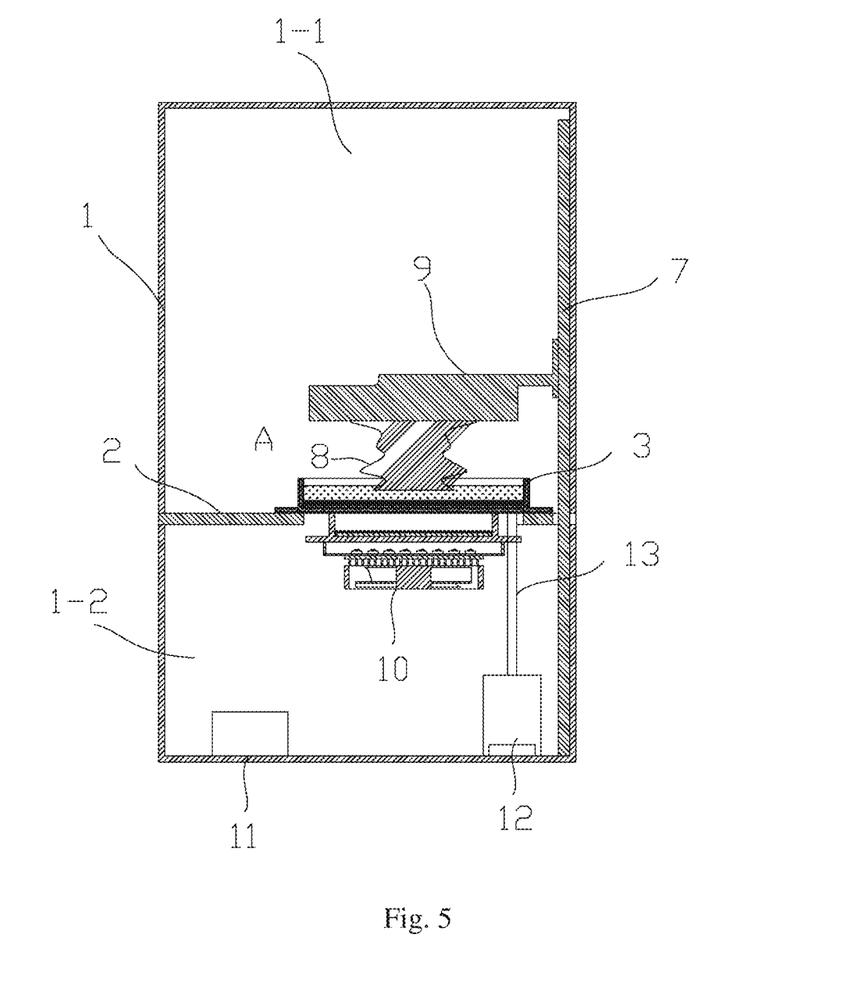
FIG. 5 is a structural schematic diagram of a photo-curing 3D printer according to another embodiment of the disclosure.
Figure 6:
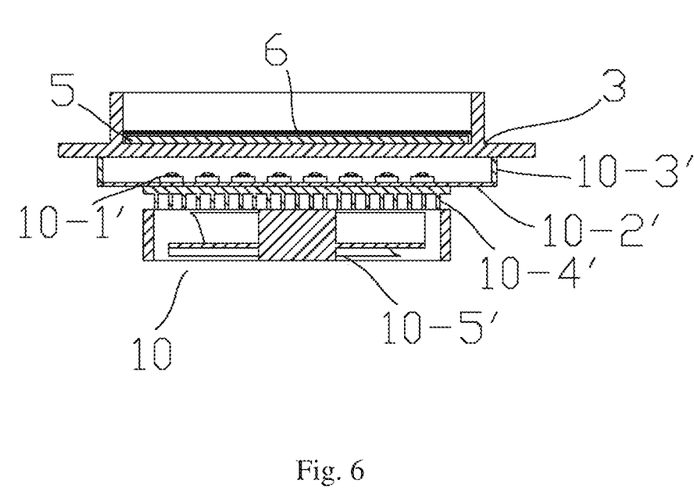
FIG. 6 is a structural schematic diagram of a light source of a photo-curing 3D printer according to another embodiment of the disclosure.

With reference to FIGS. 5 and 6, one difference between this embodiment and the above embodiment lies in the structure and the installation location of the light source.

In this embodiment, a light source 10' is directly installed underneath the bottom wall of the photosensitive resin pool 3. The light source 10' mainly comprises an LED lamp array 10-1' and a bearing plate 10-2' for bearing the LED lamp array 10-1'. A reflective plate 10-3' for reflecting light rays emitted by the LED lamp array 10-1' is provided on an upper surface of the bearing plate 10-2' along the circumference of the LED lamp array 10-1'. The bearing plate 10-2' is fixed under the bottom wall of the photosensitive resin pool 3 through the reflective plate 10-3'. The bearing plate 10-2', the reflective plate 10-3' and the bottom wall of the photosensitive resin pool 3 form a closed space for accommodating the LED lamp array 10-1'. Only the transparent bottom of the photosensitive resin pool 3 can let the light rays of the LED lamp array 10-1' pass and the reflective plate 10-3' reflects the light rays of the LED lamp array 10-1'. This can effectively avoid the exposure of light rays and thus improve the utilization of the light rays emitted by the LED lamp array 10-1'. Preferably, the distance between the LED lamp array 10-1' and the lower portion of the bottom wall of the photosensitive resin pool 3 is less than or equal to 10 mm, which can further improve the utilization of light rays.

In addition, with the increasing of the number of LED lamps of the LED lamp array 10-1', the heat generated thereby will also increase. Therefore, it is necessary to provide a heat dissipation plate 10-4' at the lower portion of the bearing plate 10-2'. A fan 10-5' is provided at the lower portion or around the heat dissipation plate 10-4' so as to send cold air to the heat dissipation plate 10-4', which accelerates the cooling speed.

A method using the photo-curing 3D printer according to an embodiment as described with reference to FIGS. 1-4 or FIGS. 5-6 is described as below.

Figure 7:
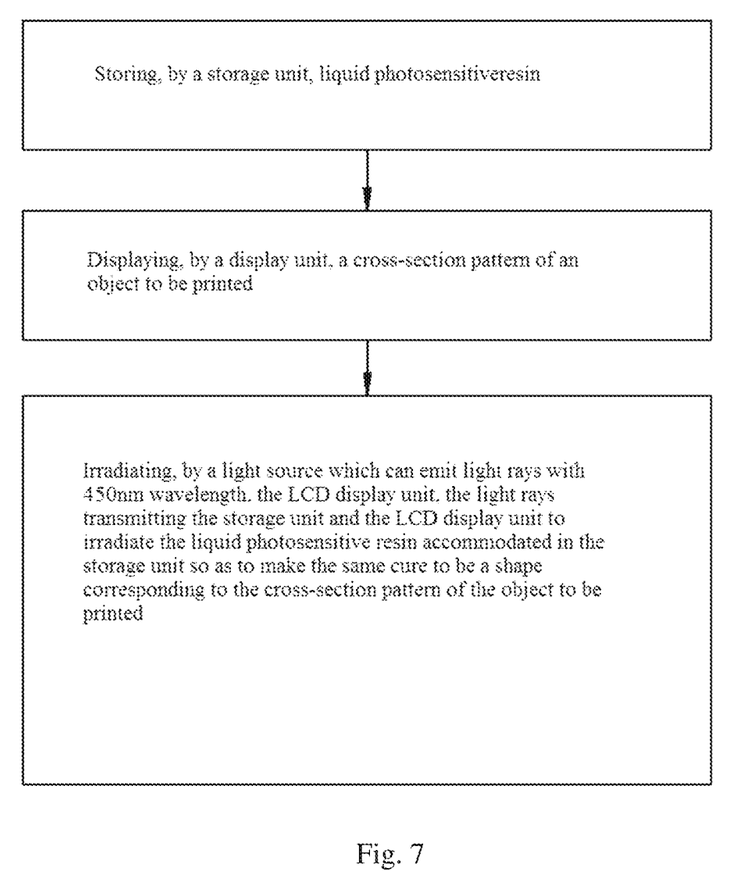
FIG. 7 is a flowchart of main steps of a photo-curing 3D printing method according to an embodiment of the disclosure.

With reference to FIG. 7, A method of photo-curing 3D printing may include accommodating, by a storage unit, liquid photosensitive resin;

displaying, by a LCD display unit, a cross-section pattern of an object to be printed; and irradiating, by a light source which is capable of emitting light rays with 420~460 nm wavelength, the LCD display unit. The light rays irradiate the liquid photosensitive resin accommodated in the storage unit by passing through the storage unit and the LCD display unit so as to make the same cured to form a shape corresponding to the cross-section pattern of the object to be printed.

Figure 8:
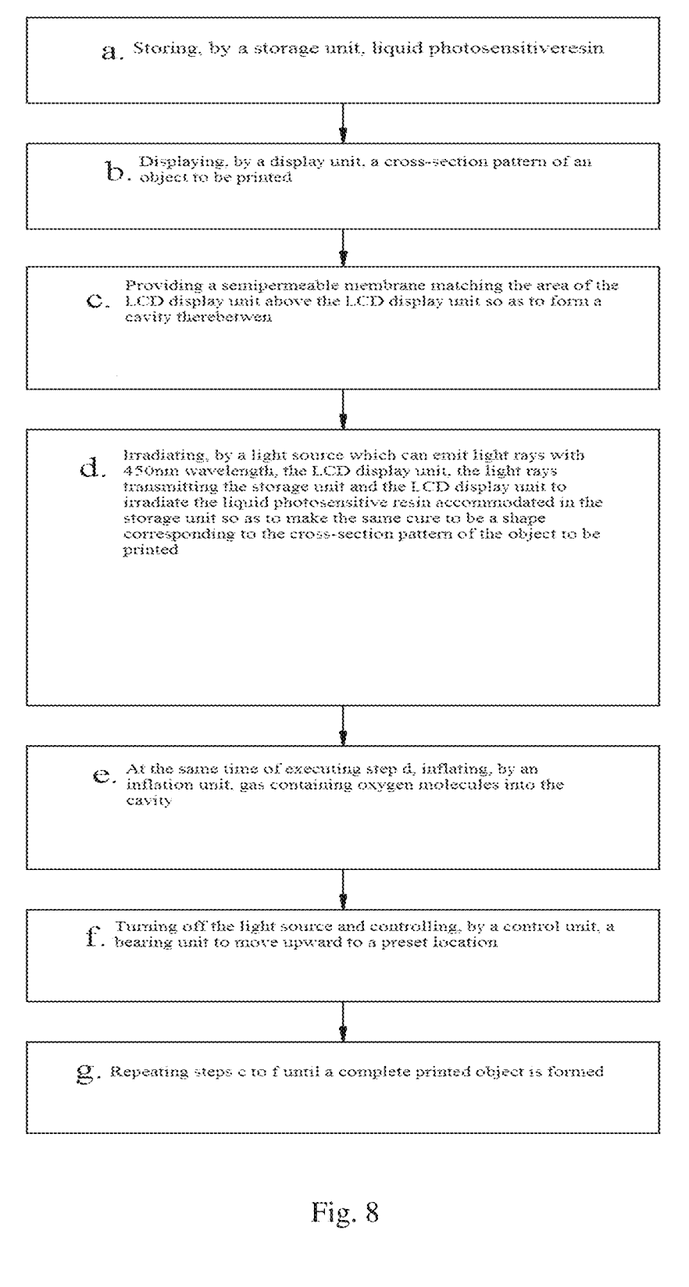
FIG. 8 is a flowchart of a photo-curing 3D printing method according to another embodiment of the disclosure.

Furthermore, with reference to FIG. 8, particular steps of using the photo-curing 3D printer provided in the description of FIGS. 1-4 or FIGS. 5-6 to print continuously and finally form a printed object include:

cleaning the photosensitive resin pool 3 and adding appropriate liquid photosensitive resin therein after the resin pool 3 is dried;

setting relevant printing parameters, including: virtualizing the shape of the object to be printed 8 and saving the same in the control unit 11; the control unit 11 dividing the virtualized object 8 to be printed into a plurality of layers with each lay having a cross-section pattern and the thickness of each layer being 100 μm; the light source 10 being turned on for 5 s (exposure time) and the air supply time of an air pump 12 being 6 s. It should be noted that if the exposure time for each of the resin layers is set to be 5 s, then it has to be ensured that the air pump 12 keeps in a turned-on state during exposure and cannot be turned on when not exposed; and in order to obtain better effects, the turning-on time of the air pump 12 can be longer than the exposure time by 1~2 s; and the control unit 11 controlling the movement of the bearing platform 9 so that the gap between the same and the high molecule semipermeable membrane 6 reaches a preset value 100 μm. The control unit 11 controls a step motor associated with the guide pillar 7 to operate so that the step motor rotates forwardly or reversely, thus driving the guide pillar 7 (screw) to rotate forwardly or reversely. The bearing platform 9 moves up and down with the rotation of the guide pillar 7;

the control unit 11 controlling the LCD display unit 5 to turn on and sending a cross-section pattern of a first layer of the object 8 to be printed to the LCD display unit;

the control unit 11 controlling the air pump 12 to turn on, the air pump 12 pumping mixed gas containing a certain oxygen proportion into the cavity 14 between the LCD display unit 5 and the high molecule semipermeable membrane 6; the oxygen molecules in the mixed gas forming a layer of oxygen molecules on its surface through the high molecule semipermeable membrane 6, and the pump being turned off after 6 s. At the same time, the control unit 11 controls the light source 10 to turn on and the light source 10 is turned off after 5 s;

the control unit 11 sending a pattern of a second cross-section (close to the first cross-section) of the object 8 to be printed to the LCD display unit 5. At the same time, the control unit 11 controls the bearing platform 9 to lift up a certain height H+h (h represents the thickness of each cured photosensitive resin layer, that is, 100 μm, H is set according to the viscosity of the photosensitive resin; the higher the viscosity is, the larger the H is. In this example, H can be 5000 μm). After the liquid photosensitive resin is separated from the bearing platform 9, the bearing platform 9 descends a distance H, that is, descends to a location which is higher than the previous location by 100 μm; and if the third, the fourth or more layers with cross-section patterns need to be printed, repeating the above steps; and if the object 8 to be printed is completely molded, then the printing is finished; the control unit 11 controlling the LCD display screen 5, the air pump 12 and the light source 10 to turn off.

In addition, except using the Fresnel lens 4 to homogenize, parallel and concentrate the visible light emitted by the light source 10, the optical power distribution of the light source 10 with 420~460 nm wavelength on the surface of the LCD display unit 5 can be obtained through calculation of the optical system and a mask data frame is thus generated. In this data frame, the gray scale corresponding to a portion with a relatively higher optical power on the surface of the LCD display unit 5 is relatively higher, and a portion with a relatively lower optical power is relatively lower. During practical printing, by performing a point-by-point multiplication operation on a white transmitting and black shadow pattern which is desired to be displayed and the mask data frame, gray scale information of the mask is overlapped to the original white transmitting and black shadow pattern. Change of the gray scale of the white transmitting portion of the original pattern can offset the impact caused by the power distribution non-uniformity of the light source and thus improve the molding quality and molding precision of the printed object.

Various examples of the present invention are described in detail above. A person skilled in that art will understand that various modifications, changes and variations can be made to the examples without departing from the scope of the present invention (which is limited by the appended claims). The scope of the claims should be explained as a whole and conforms to the broadest scope consistent with the description, which is not limited to examples or implementation models in the detailed description.

What is claimed is:

1. A photo-curing 3D printer comprising a storage unit for accommodating liquid photosensitive resin and a light source disposed underneath the storage unit, the storage unit comprises a pool having a bottom wall, an LCD display unit, and a semipermeable membrane located above the LCD display unit, the semipermeable membrane matching an area of the LCD display unit so as to form a cavity therebetween, wherein wavelength of light rays emitted by the light source is in a range selected from 420 nm to 430 nm or from 445 nm to 455 nm, and the LCD display unit is provided above the bottom wall of the pool and configured to display a pattern composed of a shielding area for shielding the light rays and a transmissive area for transmitting the light rays.

2. The photo-curing 3D printer according to claim 1, wherein the storage unit with the bottom wall of the pool is at least transparent.

3. The photo-curing 3D printer according to claim 1, wherein the light source comprises:
   a light-emitting element for emitting light rays with a wavelength in a range selected from 420 nm to 430 nm or from 445 nm to 455 nm;
   a concentration element for the light-emitting element; and
   a lens provided above the concentration element and the light-emitting element, the concentration element and the lens being configured to be capable of homogenizing and paralleling the light rays emitted by the light-emitting element.

4. The photo-curing 3D printer according to claim 3, wherein the light source further comprises:
   a heat dissipation element provided underneath the light-emitting element; and
   a blasting element provided around the heat dissipation element for sending cold air to the heat dissipation element.

5. The photo-curing 3D printer according to claim 2, wherein the light source comprises:
   a light-emitting element for emitting light rays a wavelength in a range selected from 420 nm to 430 nm or from 445 nm to 455 nm;
   a bearing plate having a bottom wall and a surrounding wall, the bottom wall of the bearing plate being used for bearing the light-emitting element and the surrounding wall of the bearing plate being used for fixedly connecting to the bottom wall of the pool.

6. The photo-curing 3D printer according to claim 5, wherein at least the surrounding wall of the bearing plate is made of a reflective material.

7. The photo-curing 3D printer according to claim 5, wherein the light source further comprises:
   a heat dissipation element provided underneath the bearing plate; and
   a blasting element provided around the heat dissipation element for sending cold air to the heat dissipation element.

8. The photo-curing 3D printer according to claim 1, wherein the storage unit further comprises:
   a Fresnel lens provided between the bottom wall of the pool and the LCD display unit.

9. The photo-curing 3D printer according to claim 1, wherein the storage unit further comprises:
   an inflation unit communicated with the cavity via a pipeline for inflating gas containing oxygen molecules into the cavity.

10. The photo-curing 3D printer according to claim 1, wherein the LCD display unit comprises a first polarization layer, a TFT layer, a liquid crystal layer and a second polarization layer from bottom to top.

11. The photo-curing 3D printer according to claim 10, wherein the liquid crystal layer is configured to have a usage state and an idle state;
   in the usage state, the liquid crystal layer is capable of changing polarization direction of polarized light transformed by the first polarization layer; and
   in the idle state, the liquid crystal layer is incapable of changing the polarization direction of the polarized light.

12. The photo-curing 3D printer according to claim 9, further comprising:
   a bearing unit provided above the storage unit for bearing cured photosensitive resin; and
   a control unit for controlling the light source to turn on or turn off the pattern display of the LCD display unit and controlling vertical movement of the bearing unit.

13. The photo-curing 3D printer according to claim 1, wherein the wavelength of the light rays emitted by the light source is 425 nm.

14. The photo-curing 3D printer according to claim 1, wherein the wavelength of the light rays emitted by the light source is 450 nm.

15. A 3D printing method comprising:
   accommodating, by a storage unit, liquid photosensitive resin;
   displaying, by an LCD display unit, a cross-section pattern of an object to be printed;
   providing a semipermeable membrane with an area matching to that of the LCD display unit above the LCD display unit so as to form a cavity therebetween;
   irradiating, by a light source which is capable of emitting light rays with a wavelength in a range selected from 420 nm to 430 nm or from 445 nm to 455 nm, the LCD display unit, the light rays irradiating the liquid photosensitive resin accommodated in the storage unit by first passing through the storage unit and then the LCD display unit so as to make the same cured with a shape corresponding to the cross-section pattern of the object to be printed; and
   at the same time of executing the step of irradiating, inflating, by an inflation unit, gas containing oxygen molecules into the cavity.

16. A 3D printing method comprising:
- accommodating, by a storage unit, liquid photosensitive resin;
- displaying, by an LCD display unit, a cross-section pattern of an object to be printed;
- providing a semipermeable membrane with an area matching to that of the LCD display unit above the LCD display unit so as to form a cavity therebetween;
- irradiating, by a light source which is capable of emitting light rays with a wavelength in a range selected from 420 nm to 430 nm or from 445 nm to 455 nm, the LCD display unit, the light rays irradiating the liquid photosensitive resin accommodated in the storage unit by first passing through the storage unit and then the LCD display unit so as to make the same cured with a shape corresponding to the cross-section pattern of the object to be printed on a bearing unit;
- at the same time of executing the step of irradiating, inflating, by an inflation unit, gas containing oxygen molecules into the cavity;
- turning off the light source and controlling, by a control unit, the bearing unit to move to a predetermined location; and
- repeating steps displaying, providing, irradiating, inflating and turning off the light source until a complete printed object is formed.

\* \* \* \* \*